United States Patent
Jing et al.

(10) Patent No.: US 10,665,756 B2
(45) Date of Patent: May 26, 2020

(54) OPTOELECTRONIC DEVICE

(71) Applicant: EPISTAR CORPORATION, Hsinchu (TW)

(72) Inventors: Chang-Huei Jing, Hsinchu (TW); Chien-Fu Shen, Hsinchu (TW)

(73) Assignee: EPISTAR CORPORATION, Hsinshu (TW)

( * ) Notice: Subject to any disclaimer, the term of this patent is extended or adjusted under 35 U.S.C. 154(b) by 0 days.

(21) Appl. No.: 16/559,117

(22) Filed: Sep. 3, 2019

(65) Prior Publication Data
US 2020/0006600 A1 Jan. 2, 2020

Related U.S. Application Data

(63) Continuation of application No. 15/952,197, filed on Apr. 12, 2018, now Pat. No. 10,418,524, which is a (Continued)

(30) Foreign Application Priority Data

Oct. 20, 2009 (TW) .............................. 98305006 A
Feb. 10, 2010 (TW) .............................. 99300687 A

(51) Int. Cl.
*H01L 33/08* (2010.01)
*H01L 23/00* (2006.01)
(Continued)

(52) U.S. Cl.
CPC ........ *H01L 33/387* (2013.01); *H01L 25/0753* (2013.01); *H01L 27/15* (2013.01);
(Continued)

(58) Field of Classification Search
CPC ..... H01L 2924/00; H01L 33/20; H01L 33/38; H01L 33/62; H01L 2924/12041; H01L 27/156
See application file for complete search history.

(56) References Cited

U.S. PATENT DOCUMENTS 6,486,499 B1  11/2002  Krames et al.
6,518,598 B1   2/2003  Chen
(Continued)

FOREIGN PATENT DOCUMENTS

CN   101093849 A   12/2007
CN   101051662 B    4/2010
(Continued)

OTHER PUBLICATIONS

Official Letter dated Jan. 28, 2015, from Korea Patent Office for corresponding Korean Patent Application No. 2008-0072555.

*Primary Examiner* — Bradley Smith
*Assistant Examiner* — David J Goodwin
(74) *Attorney, Agent, or Firm* — Patterson + Sheridan, LLP

(57) ABSTRACT

An optoelectronic device comprises a substrate; a groove on the substrate; a plurality of semiconductor units on the substrate and separated by the groove, wherein each semiconductor unit comprises a first semiconductor layer, a second semiconductor layer, and an active region interposed between the first semiconductor layer and the second semiconductor layer; a connecting part crossing the groove for connecting two of the plurality of semiconductor units, wherein the connecting part comprises one end on the first semiconductor layer and another end on the second semiconductor layer; a first electrode comprising a plurality of first extensions jointly connected to the one end of the connecting part; and a second electrode comprising a plurality of second extensions jointly connected to the another end of the connecting part, wherein an amount of the plurality of first extensions is different from an amount of the plurality of second extensions.

20 Claims, 24 Drawing Sheets

Related U.S. Application Data continuation of application No. 15/097,468, filed on Apr. 13, 2016, now Pat. No. 9,985,184, which is a continuation of application No. 12/830,059, filed on Jul. 2, 2010, now Pat. No. 9,324,691.

(51) Int. Cl.

| | | |
|---|---|---|
| *H01L 27/15* | (2006.01) | |
| *H01L 33/38* | (2010.01) | |
| *H01L 25/075* | (2006.01) | |
| *H01L 33/00* | (2010.01) | |
| *H01L 33/20* | (2010.01) | |
| *H01L 33/62* | (2010.01) | |

(52) U.S. Cl.
CPC ........ *H01L 33/0012* (2013.01); *H01L 33/382* (2013.01); *H01L 33/20* (2013.01); *H01L 33/62* (2013.01); *H01L 2924/0002* (2013.01)

(56) References Cited

U.S. PATENT DOCUMENTS

| | | | |
|---|---|---|---|
| 6,614,056 B1 | 9/2003 | Tarsa et al. | |
| 6,885,035 B2 | 4/2005 | Bhat et al. | |
| 7,034,470 B2 | 4/2006 | Cok et al. | |
| 7,193,245 B2 | 3/2007 | Zhao et al. | |
| 7,531,841 B2 | 5/2009 | Ko et al. | |
| 7,646,031 B2 | 1/2010 | Sakai et al. | |
| D619,976 S | 7/2010 | Liu et al. | |
| D644,187 S | 8/2011 | Shen et al. | |
| 8,129,729 B2 | 3/2012 | Sakai et al. | |
| 8,283,682 B2 | 10/2012 | Yoon et al. | |
| 8,928,015 B2 | 1/2015 | Lim et al. | |
| 2003/0047743 A1 | 3/2003 | Li | |
| 2003/0107053 A1 | 6/2003 | Uemura et al. | |
| 2006/0192223 A1 | 8/2006 | Lee et al. | |
| 2006/0256826 A1 | 11/2006 | Lin et al. | |
| 2009/0322241 A1* | 12/2009 | Onushkin | H05B 45/40 315/250 |
| 2010/0109026 A1 | 5/2010 | Onushkin et al. | |
| 2011/0222285 A1* | 9/2011 | Ye | H01L 33/08 362/249.02 |
| 2013/0299853 A1* | 11/2013 | Chen | H01L 33/36 257/88 |

FOREIGN PATENT DOCUMENTS

| | | |
|---|---|---|
| CN | 101764187 A | 6/2010 |
| JP | 3117281 U | 12/2000 |
| JP | 2001156331 A | 6/2001 |
| JP | 2001345480 A | 12/2001 |
| JP | 2005039264 A | 2/2005 |
| JP | 2005079202 A | 3/2005 |
| JP | 2005085548 A | 3/2005 |
| JP | 2009531839 A | 9/2009 |
| JP | 2010016333 A | 1/2010 |
| JP | 2010056195 A | 3/2010 |
| KR | 20080072555 A | 8/2008 |
| TW | I384637 B | 2/2013 |

* cited by examiner

OPTOELECTRONIC DEVICE

REFERENCE TO RELATED APPLICATION

This application is a continuation application of U.S. patent application Ser. No. 15/952,197, filed on Apr. 12, 2018, now pending, which is a continuation application of U.S. patent application Ser. No. 15/097,468, filed on Apr. 13, 2016, now U.S. Pat. No. 9,985,184, which is a continuation application of U.S. patent application Ser. No. 12/830,059, filed on Jul. 2, 2010, now U.S. Pat. No. 9,324,691, which claims the right of priority based on TW application Serial No. 098305006, filed on Oct. 20, 2009 and the right of priority based on TW application Serial No. 099300687, filed on Feb. 10, 2010, and the contents of which are hereby incorporated by references in their entireties.

BACKGROUND

Technical Field

The present invention relates to a light-emitting element array.

Description of the Related Art

The light-emitting diodes (LEDs) of the solid-state lighting elements have the characteristics of low power consumption, low heat generation, long operation life, crashproof, small volume, quick response and good optoelectrical property like light emission with a stable wavelength, so the LEDs have been widely used in household appliances, indicator light of instruments, and optoelectrical products, etc. As the opto-electrical technology develops, the solid-state lighting elements have great progress in the light efficiency, operation life and the brightness, and LEDs are expected to become the main stream of the lighting devices in the near future.

Now, the LEDs are used in an array type light-emitting element, which can be applied to more applications with high driving voltage, and decrease the volume and weight of LED. The manufacturers design various kinds of electrode layout of the array type light-emitting element to satisfy customers' requirements of LEDs with high driving voltage, and to increase the production efficiency with lower cost.

SUMMARY OF THE DISCLOSURE

An optoelectronic device comprises a substrate; a plurality of semiconductor units electrically connected with each other and disposed jointly on the substrate, wherein each semiconductor unit comprises a first semiconductor layer, a second semiconductor layer, and an active region interposed between thereof; a plurality of first electrodes disposed on each first semiconductor layer respectively; a connecting part formed on the semiconductor units to electrically connect the semiconductor units in series; and a plurality of second electrodes disposed on each second semiconductor layer respectively, wherein at least one of the first electrodes comprises a first extension, and at least one of the second electrodes comprises a second extension.

An optoelectronic device comprises a substrate; a plurality of semiconductor units electrically connected with each other and disposed jointly on the substrate, wherein each semiconductor unit comprises a first semiconductor layer, a second semiconductor layer, and an active region interposed between thereof; a plurality of first electrodes disposed on each first semiconductor layer respectively; and a plurality of second electrodes disposed on each second semiconductor layer respectively, wherein at least one of the first electrodes comprises a first extension, and at least one of the second electrodes comprises a second extension, wherein at least one of the first extension and the second extension comprises a curve which is not parallel to the edge of the semiconductor units.

An optoelectronic device comprises a substrate; a plurality of semiconductor units electrically connected with each other and disposed jointly on the substrate, wherein each semiconductor unit comprises a first semiconductor layer, a second semiconductor layer, and an active region interposed between thereof; a plurality of first electrodes disposed on each first semiconductor layer respectively; and a plurality of second electrodes disposed on each second semiconductor layer respectively; wherein at least one of the first electrodes comprises a first extension, and at least one of the second electrodes comprises a second extension, wherein the areas of each of the semiconductor units are substantially the same, and/or the semiconductor units comprise at least two different shapes.

An optoelectronic device comprising: a substrate; a plurality of semiconductor units electrically connected with each other and disposed jointly on the substrate, wherein each semiconductor unit comprises a first semiconductor layer, a second semiconductor layer, and an active region interposed between thereof; a plurality of first electrodes disposed on each first semiconductor layer respectively; and a plurality of second electrodes disposed on each second semiconductor layer respectively, wherein the plurality of semiconductor units comprises a first semiconductor unit, a second semiconductor unit and a third semiconductor unit, at least one of the first electrodes comprises a first pad disposed on the first semiconductor unit on the most outside of the substrate, and at least one of the second electrodes comprises a second pad disposed on the second semiconductor units on the most outside of the substrate; wherein the first electrode and the second electrode comprises a first extension and a second extension disposed on the third semiconductor unit without any pad.

An optoelectronic device comprises a substrate; a plurality of semiconductor units electrically connected with each other and disposed jointly on the substrate; wherein each semiconductor unit comprises a first semiconductor layer, a second semiconductor layer, and an active layer interposed between thereof; a plurality of first electrodes disposed on each first semiconductor layer respectively; and a plurality of second electrodes disposed on each second semiconductor layer respectively; wherein the plurality of semiconductor units comprises a first semiconductor unit and a second semiconductor unit, at least one of the first electrodes comprises a first curve extension disposed on the first edge of the first semiconductor unit, and at least one of the second electrode comprises a second curve extension disposed on the second edge of the second semiconductor unit, wherein the first edge and the second edge are adjacent to each other, and the first curve extension and the second curve extension are electrically connected by a conductive part.

An optoelectronic device comprises a substrate; a groove on the substrate; a plurality of semiconductor units on the substrate and separated by the groove, wherein each semiconductor unit comprises a first semiconductor layer, a second semiconductor layer, and an active region interposed between the first semiconductor layer and the second semiconductor layer; a connecting part crossing the groove for connecting two of the plurality of semiconductor units, wherein the connecting part comprises one end on the first semiconductor layer and another end on the second semiconductor layer; a first electrode comprising a plurality of first extensions jointly connected to the one end of the connecting part; and a second electrode comprising a plurality of second extensions jointly connected to the another end of the connecting part, wherein an amount of the plurality of first extensions is different from an amount of the plurality of second extensions.

An optoelectronic device comprises a substrate; a plurality of semiconductor units comprising a first group of semiconductor units arranged in a first column and a second group of semiconductor units arranged in a second column, wherein each of the plurality of semiconductor units comprises a first semiconductor layer, a second semiconductor layer, and an active region interposed between the first semiconductor layer and the second semiconductor layer, an amount of the first group of semiconductor units is different from an amount of the second group of semiconductor units, the first group of semiconductor units comprises a rectangular shape different from that of the second group of semiconductor units; a first electrode disposed on the first semiconductor layer, the first electrode comprising a first extension; and a second electrode disposed on the second semiconductor layer, the second electrode comprising a second extension.

An optoelectronic device comprises a substrate; a plurality of semiconductor units arranged in multiple columns, wherein the multiple columns comprise a first column, a second column, and a third column, the plurality of semiconductor units comprises a first semiconductor unit arranged in the first column, a second semiconductor unit arranged in the second column, and a third semiconductor unit in the third column, wherein each of the plurality of semiconductor units comprises a first semiconductor layer, a second semiconductor layer, and an active region interposed between the first semiconductor layer and the second semiconductor layer; a first electrode disposed on the first semiconductor layer; and a second electrode disposed on the second semiconductor layer, wherein an electrode layout of the first semiconductor unit, the second semiconductor unit and the third semiconductor unit are different from each other.

An optoelectronic device comprises a substrate; a groove on the substrate; a plurality of semiconductor units on the substrate and separated from each other by the groove, wherein the plurality of semiconductor units are arranged in a first column and a second column, the plurality of semiconductor units comprises a first semiconductor unit arranged in the first column and a second semiconductor unit arranged in the second column, each semiconductor unit comprises a first semiconductor layer, a second semiconductor layer, and an active region interposed between the first semiconductor layer and the second semiconductor layer; a first connecting part comprising a first portion on the first semiconductor layer of the second semiconductor unit and a second portion on the second semiconductor layer of the first semiconductor unit; a first electrode formed on the first semiconductor layer of the second semiconductor unit and extended from a first corner of the first connecting part; and a second electrode formed on the second semiconductor layer of the first semiconductor unit and extended from a second corner of the first connecting part, wherein the first corner and the second corner are disposed on a diagonal line of the first connecting part.

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

DESCRIPTION OF THE PREFERRED EMBODIMENTS

Figure 1:
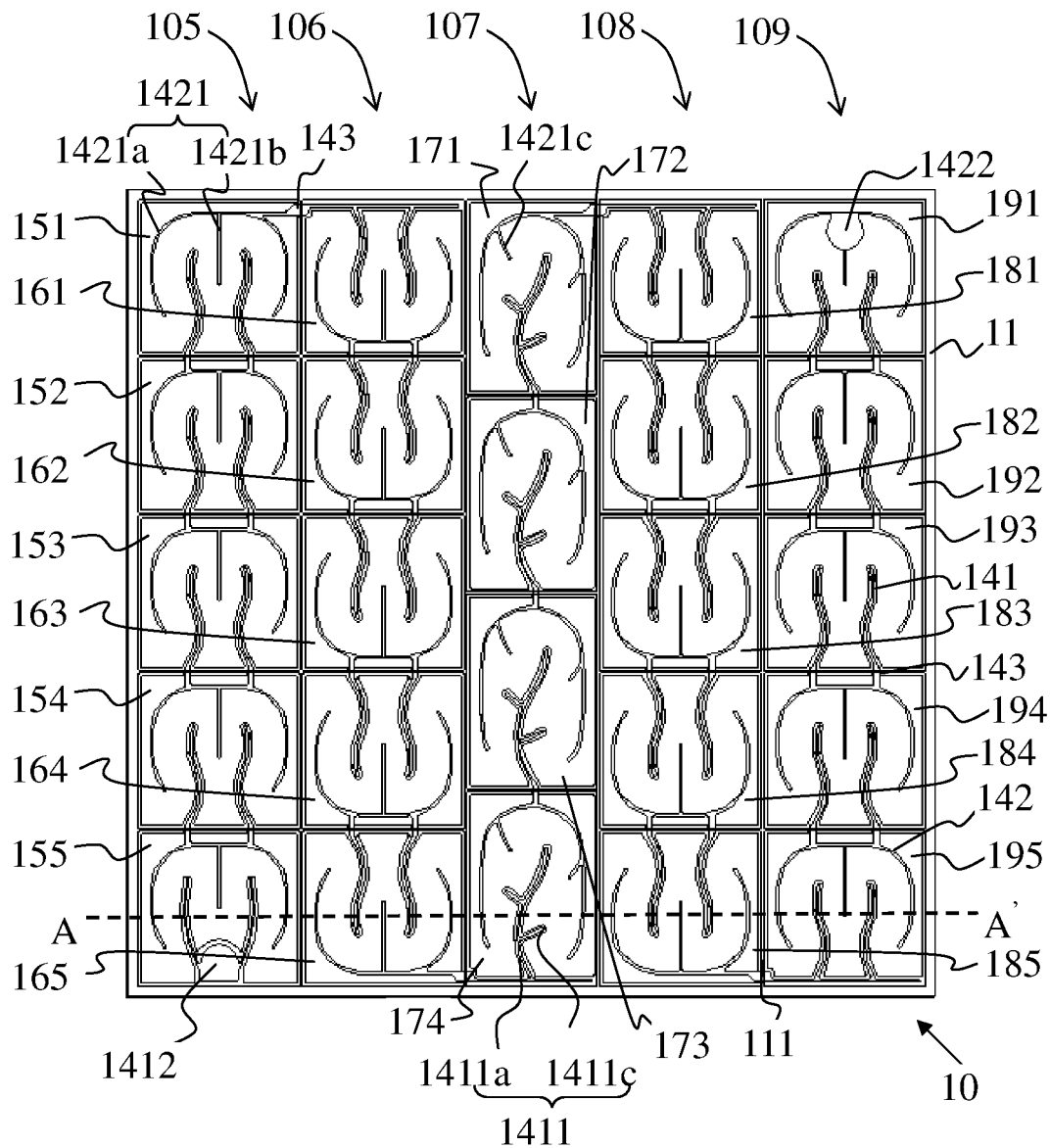
FIG. 1 illustrates a top view of the optoelectronic device in accordance with one embodiment of the present application.

Reference is made in detail to the preferred embodiments of the present application, examples of which are illustrated in the accompanying drawings. Wherever possible, the same reference numbers are used in the drawings and the description to refer to the same or like parts.

Figure 2:
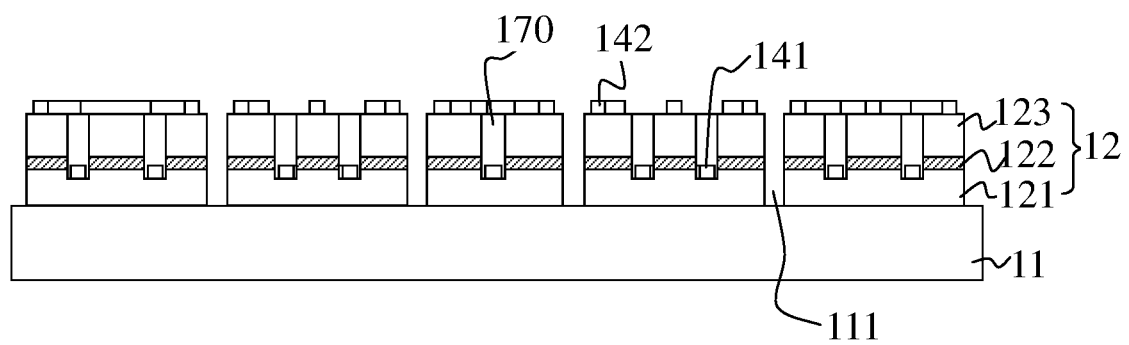
FIG. 2 illustrates a cross-sectional view of the optoelectronic device shown in FIG. 1.

FIG. 1 illustrates a top view of an optoelectronic device 10 in accordance with the first embodiment of the present application. The optoelectronic device 10, such as a light-emitting diode (LED), a laser diode (LD), or a solar cell, includes a plurality of semiconductor units formed on a substrate 11, first electrodes 141, second electrodes 142, and connecting parts 143 formed on the semiconductor units. FIG. 2 illustrates a cross-sectional view of the optoelectronic device 10 alone the A-A' line in FIG. 1. Each semiconductor unit includes a first semiconductor layer 121, a second semiconductor layer 123, and an active region 122 interposed between thereof. The material of the first semiconductor layer 121 is an III-V semiconductor material doped with p-type dopant or n-type dopant. The material of the second semiconductor layer 123 is a III-V semiconductor material doped with p-type dopant or n-type dopant. The conductivities of the first semiconductor layer 121 and that of the second semiconductor layer 123 are opposite. The active region includes a single heterostructure (SH), a double heterostructure (DH), or a multi-quantum well (MQW) structure. Trenches 170 are formed in the semiconductor units by etching the semiconductor units. A part of the first semiconductor layer 121 is exposed through the trench 170. A plurality of separation grooves 111 are formed between the semiconductor units and expose a part of the substrate 11. There are a plurality of first electrodes 141 and second electrodes 142 on the optoelectronic device 10. The first electrodes 141 are formed on the exposed first semiconductor layer 121, and the second electrodes 142 are formed on the second semiconductor layer 123. The first electrode 141 formed on the semiconductor unit includes first extensions 1411, and the second electrode 142 formed on the semiconductor unit includes a second extensions 1421. The first electrode 141 formed on one of the semiconductor units includes a first pad 1412, and the second electrode 142 formed on another one of the semiconductor units includes a second pad 1422.

In order to satisfy customers' request that the optoelectronic device can work under a required area, current and driving voltage, the layouts of the semiconductor units and the electrodes have to be designed. The equation of the number of semiconductor unit is $$n = \left(\frac{V}{V_f} - 1\right) \cdot \left(\frac{V}{V_f}\right), \text{ or } \left(\frac{V}{V_f} + 1\right),$$

wherein n is the number of semiconductor unit, V is the driving voltage of the optoelectronic device, $V_f$ is the driving voltage of the semiconductor unit. In the embodiment, the size of the optoelectronic device 10 is 85×85 mil$^2$, and the driving voltage is 72 V. The driving voltage of each semiconductor unit is substantially 3 V. The driving voltage of the semiconductor unit can be changed through the manufacture process control and the quality of the epitaxy layers. Normally, the lower driving voltage of the semiconductor unit is better at the electrical efficiency of the optoelectronic device. The area of each semiconductor unit is the same with each other. According to the equation, the optoelectronic device 10 includes twenty-four semiconductor units arranged in five columns 105, 106, 107, 108, and 109. The first column 105 includes five semiconductor units 151, 152, 153, 154, and 155 connected in series in a first orientation. The second column 106 includes five semiconductor units 161, 162, 163, 164, and 165 connected in series in a second orientation. The third column 107 includes four semiconductor units 171, 172, 173, and 174 connected in series in the first orientation. The fourth column 108 includes five semiconductor units 181, 182, 183, 184, and 185 connected in series in the second orientation. The fifth column 109 includes five semiconductor units 191, 192, 193, 194, and 195 connected in series in the first orientation. The first and second orientations are opposite. It is easily arranged with the layout that each column includes different number of semiconductor units to satisfy customers' request.

Figure 3:
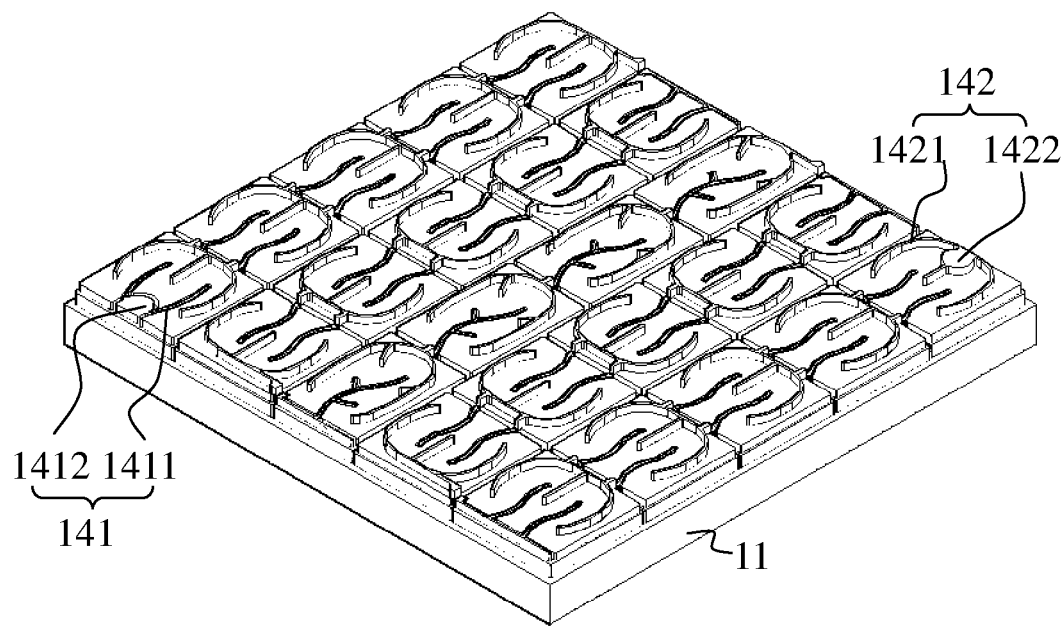
FIG. 3 illustrates a three-dimensional view of the optoelectronic device shown in FIG. 1.

The shape of the semiconductor units in the third column 107 is rectangular and is different from that of the semiconductor units in the other columns. With this design it is easier to arrange the electrodes. Referring to FIG. 1 and FIG. 3, the layouts of electrodes on semiconductor units in first column 105 and fifth column 109 are similar except that of electrodes on semiconductor units 151, 155, 191 and 195 on the corner region of the substrate 11. The layouts of electrodes on the semiconductor units in second column 106 and fourth column 108 are the same except that of electrodes on semiconductor units 161, 165, 181 and 185 close to the edge of the substrate 11. The layout of the electrode on the semiconductor units in the third column 107 is the most different from that of the electrode on the other semiconductor units due to the shape of the semiconductor units. The layouts of the electrodes on the semiconductor units 172 and 173 are the same but different from the layouts of the electrodes on the semiconductor units 171 and 174 close to the edge of the substrate 11.

The first extensions 1411 include a first curve extension 1411a, and the second extensions 1421 include a second curve extension 1421a. The second extensions 1421 further include a straight extension 1421b on the semiconductor units in columns 105, 106, 108, and 109. The first curve extensions 1411a and/or the second curve extensions 1421a are not parallel to any edge of the semiconductor units. The first extensions 1411 on the semiconductor units in first, third and fifth columns 105, 107, 109 are disposed on the surface of the trench 170 and extended from the first edge of the semiconductor units to the second edge opposite to the first edge; and the second extension 1421 is extended from the second edge to the first edge. The first extensions 1411 of the semiconductor units in the second and fourth columns 106, 108 are extended from the second edge of the semiconductor units to the first edge, and the second extensions 1421 are extended from the first edge to the second edge. In this embodiment, the second extensions 1421 are disposed substantially around the edges of the semiconductor units and the first extensions 1411 are interposed between thereof. The quantity of the extension can be adjusted based on the area of the semiconductor unit. If the larger area the semiconductor unit is, the more extensions the semiconductor unit needs. A secondary extension 1411c and/or a secondary extension 1421c extend from the first curve extension 1411a and the second curve extension 1421a can be formed to increase the current spreading.

The first pad 1412 and the second pad 1422 are formed on the semiconductor units 155 and 191 located in the opposite corner regions of the substrate 11 respectively. The first pad 1412 is in contact with the first extension 1411 on the semiconductor units 155. The second pad 1422 is in contact with the second extension 1421 on the semiconductor units 191. The pads are formed for wire bonding or flip chip type bonding. In order to decrease the difficulty of bonding, the pads are preferred to be arranged on different semiconductor units on the most outside of the substrate 11 respectively.

Figure 4:
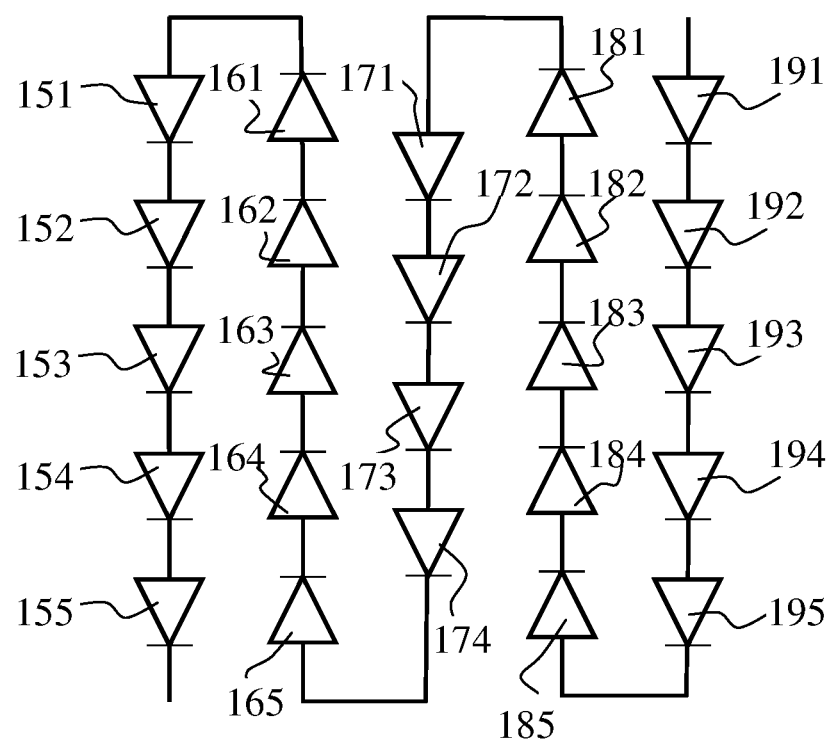
FIG. 4 illustrates an equivalent circuit diagram of the optoelectronic device shown in FIG. 1.

In order to electrically connect the semiconductor units, a connecting part 143 is formed between the semiconductor units. The connecting part 143 is in contact with for example the first extension 1411 on the first semiconductor unit and the second extension 1421 on the second semiconductor unit adjacent to the first semiconductor unit. In the embodiment, the connecting parts 143 form a serial connection between the semiconductor units in the first, third, and fifth columns 105, 107, 109 in a first orientation, and a reverse serial connection between the semiconductor units in the second, fourth columns 106, 109 in a second orientation. The columns form a serial connection due to a connection between the semiconductor units 151 and 161, 165 and 174, 171 and 181, and 185 and 195 by connecting parts 143. There are two connecting parts 143 between each two semiconductor units in the first, second, fourth, and fifth columns 105, 106, 108, 109; one connecting part 143 between each two semiconductor units in the third column 107. FIG. 4 is an equivalent circuit diagram of the optoelectronic device 10 shown in FIG. 1.

The optoelectronic device 10 can further include a transparent conductive layer formed between the second semiconductor layer 123 and the second electrode 142. The material of the transparent conductive layer is a metal oxide material such as indium tin oxide (ITO), cadmium tin oxide (CTO), antimony tin oxide, indium zinc oxide, zinc aluminum oxide, or zinc tin oxide. A metal layer with a thickness light can pass also can be the transparent conductive layer.

An adhesive layer can be further formed between the substrate 11 and the first semiconductor layer 121 for attaching the semiconductor units to the substrate 11. The adhesive layer is an insulating transparent adhesive layer or a conductive adhesive layer. The insulating transparent adhesive layer can be polyimide (PI), benzocyclobutene (BCB), or perfluorocyclobutene (PFCB). The material of the conductive layer is metal oxide material or metal. The metal oxide material includes indium tin oxide (ITO), cadmium tin oxide (CTO), antimony tin oxide, indium zinc oxide, zinc aluminum oxide, or zinc tin oxide. The metal material includes Ni, Au, Ti, Cr, Al, or Pt. The separation grooves 111 are formed between the semiconductor units, and a part of the substrate 11 and/or the insulating transparent adhesive layer is exposed by the separation groove 111. When the adhesive layer is the conductive adhesive layer, the separation grooves 111 have to pass through the conductive adhesive layer and the substrate 11 which is exposed for electric insulation between semiconductor units and the substrate has to be an insulating material such as AlN, sapphire, or glass.

Figure 5:
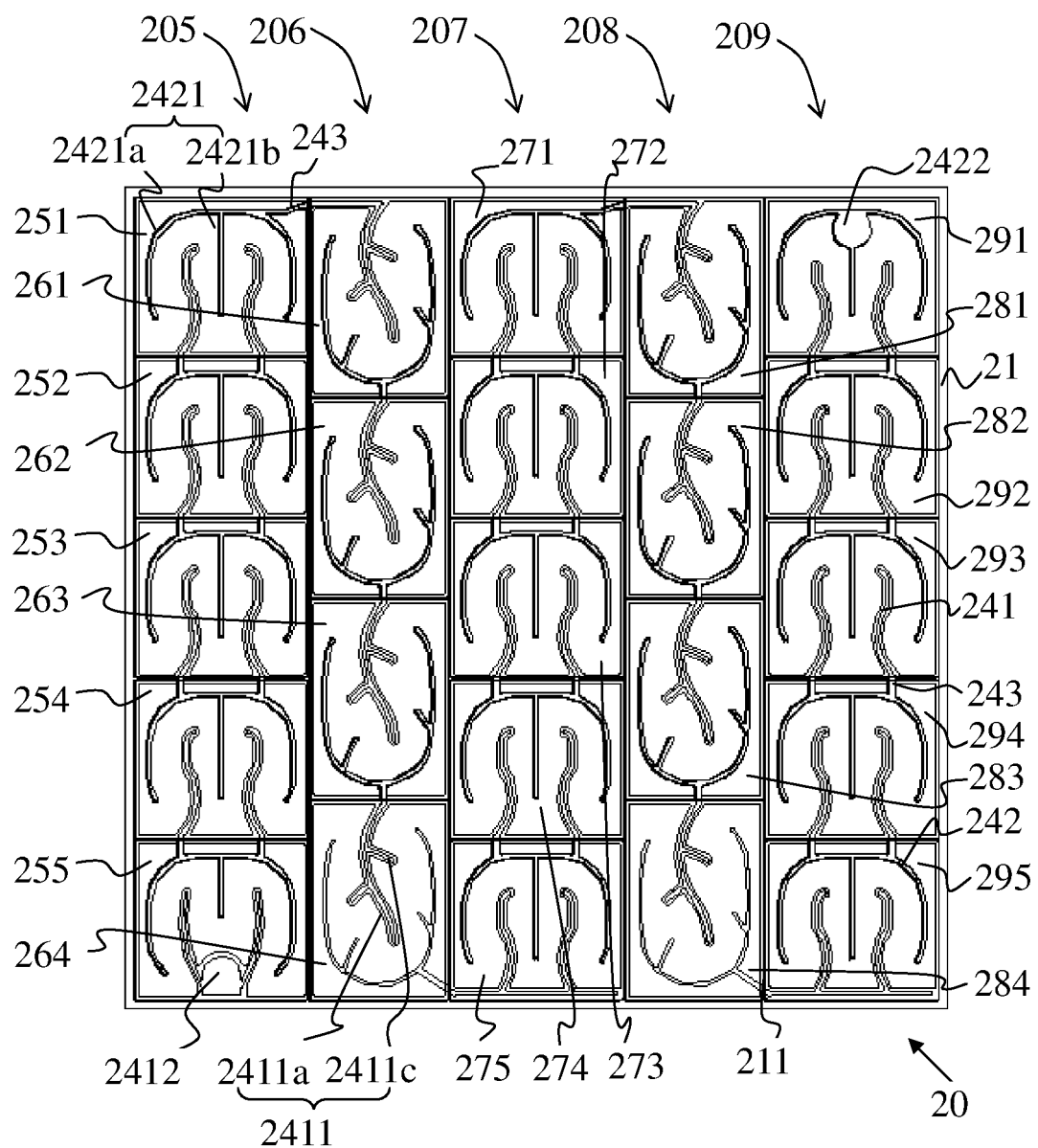
FIG. 5 illustrates a top view of the optoelectronic device in accordance with one embodiment of the present application.
Figure 6:
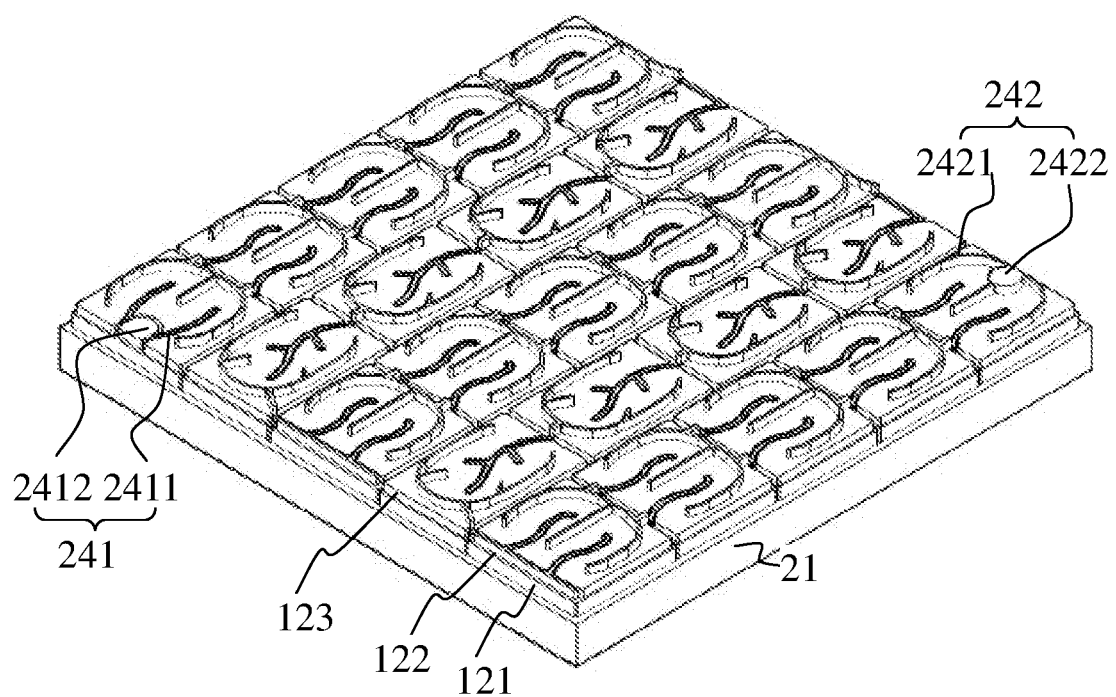
FIG. 6 illustrates a three-dimensional view of the optoelectronic device shown in FIG. 5.

FIG. 5 illustrates a top view of an optoelectronic device 20 in accordance with the second embodiment of the present application. Referring to FIGS. 5-6, the optoelectronic device 20 includes a plurality of semiconductor units formed on a substrate 21 and separated by trenches, first electrodes 241, second electrodes 242, and connecting parts 243 formed on the semiconductor units. The structure of the semiconductor units is the same as that in the optoelectronic device 10 including the first semiconductor layer 121, the second semiconductor layer 123, and the active region 122 interposed between thereof. A plurality of separation grooves 211 are formed between the semiconductor units. There are a plurality of first electrodes 241 and second electrodes 242 on the optoelectronic device 20. The first electrodes 241 are formed on the exposed first semiconductor layer 121, and the second electrodes 242 are formed on the second semiconductor layer 123. The first electrodes 241 include first extensions 2411, and the second electrodes 242 include second extensions 2421. The first electrode 241 formed on one of the semiconductor units includes a first pad 2412, and the second electrode 242 formed on another one of the semiconductor units includes a second pad 2422.

In the embodiment, the size of the optoelectronic device 20 is 85×85 mil², and the driving voltage is 72 V. The area of each semiconductor unit is the same with each other. According to the equation $$\left(\frac{V}{V_f} - 1\right),$$

the optoelectronic device 20 includes twenty-three semiconductor units arranged in five columns 205, 206, 207, 208, and 209. The first column 205 includes five semiconductor units 251, 252, 253, 254, and 255 connected in series in a first orientation, and the electrode layout is the same as that of the semiconductor units in the first column 105 in optoelectronic device 10. The second column 206 includes four semiconductor units 261, 262, 263, and 264 connected in series in a second orientation, and the electrode layout is the same as that of the semiconductor units in the third column 107 in optoelectronic device 10. The third column 207 includes five semiconductor units 271, 272, 273, 274, and 275 connected in series in the first orientation, and the electrode layout is the same as that of the semiconductor units in the first column 105 in optoelectronic device 10. The fourth column 208 includes four semiconductor units 281, 282, 283, and 284 connected in series in the second orientation, and the electrode layout is the same as that of the semiconductor units in the third column 107 in optoelectronic device 10. The fifth column 209 includes five semiconductor units 291, 292, 293, 294, and 295 connected in series in the first orientation, and the electrode layout is the same as that of the semiconductor units in the first column 105 in optoelectronic device 10.

The shape of the semiconductor units in the second and fourth columns 206 and 208 is rectangular and is different from that of the semiconductor units in the other columns Referring to FIG. 5 and FIG. 6, the layouts of electrodes on semiconductor units in first column 205, third column 207, and fifth column 209 are similar to each other except that of the electrodes on the semiconductor units 251, 255, 271, 275, 291 and 295. The layouts of electrodes on the semiconductor units in second column 206 and fourth column 208 are the same except that of electrodes on the semiconductor units 261, 264, 281, and 284. The first extensions 2411 include a first curve extension 2411a, and the second extensions 2421 include a second curve extension 2421a. The second extensions 2421 further include a straight extension 2421b on the semiconductor units in columns 205, 207, and 209. The first curve extensions 2411a and the second curve extension 2421a are not parallel to any edges of the semiconductor units. The first extensions 2411 on the semiconductor units in first, third and fifth columns 205, 207, 209 are disposed on the first semiconductor layer 121 and extended from the first edge of the semiconductor units to the second edge opposite to the first edge, and the second extension 2421 is extended from the second edge to the first edge. The first extensions 2411 on the semiconductor units in second and fourth columns 206, 208 are extended from the second edge of the semiconductor units to the first edge, and the second extensions 2421 are extended from the first edge to the second edge. In this embodiment, the second extensions 2421 are disposed substantially around the edges of the semiconductor units and the first extensions are interposed between thereof. A secondary extension 2411c extended from the first curve extension 2411a can be formed to increase the current spreading.

The first pad 2412 and the second pad 2422 are formed on the semiconductor units 255 and 291 respectively. The first pad 2412 is in contact with the first extension 2411 on the semiconductor units 255. The second pad 2422 is in contact with the second extension 2421 on the semiconductor units 291. The pads are formed for bonding and arranged on the different semiconductor units on the corner regions of the substrate 21 respectively.

Figure 7:
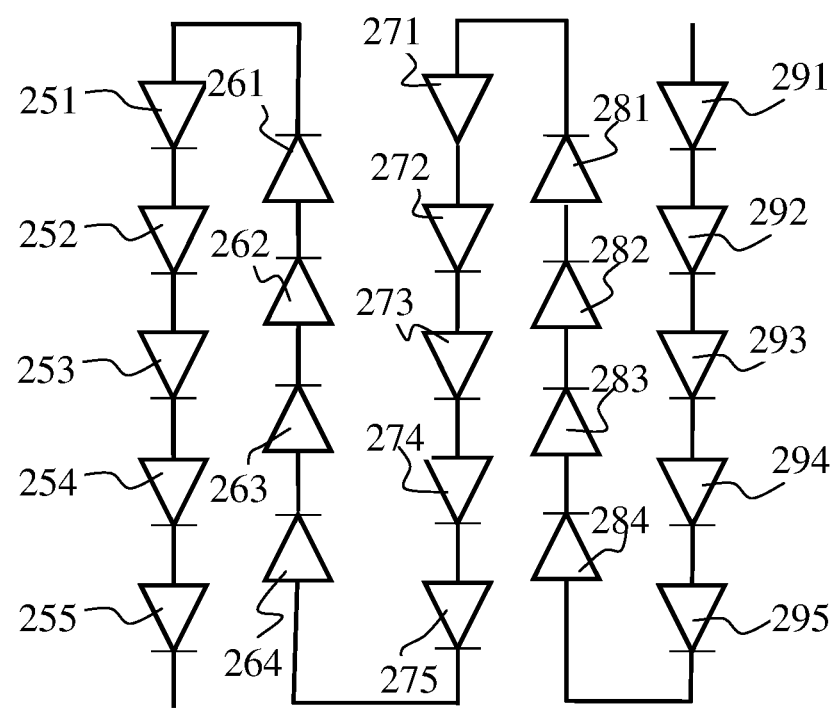
FIG. 7 illustrates an equivalent circuit diagram of the optoelectronic device shown in FIG. 5.

In the embodiment, connecting parts 243 form a serial connection between the semiconductor units in the first, third, and fifth columns 205, 207, 209 in a first orientation, and a reverse serial connection between the semiconductor units in the second, and fourth columns 206, 209 in a second orientation. The columns connect in series between the semiconductor units 251 and 261, 264 and 275, 271 and 281, and 284 and 295 by connecting parts 243. There are two connecting parts 243 between each two semiconductor units in the first, third, and fifth columns 205, 207, 209, and one connecting part 243 between each two semiconductor units in the second column 206 and fourth column 208. FIG. 7 is an equivalent circuit diagram of the optoelectronic device 20 shown in FIG. 5.

Figure 8:
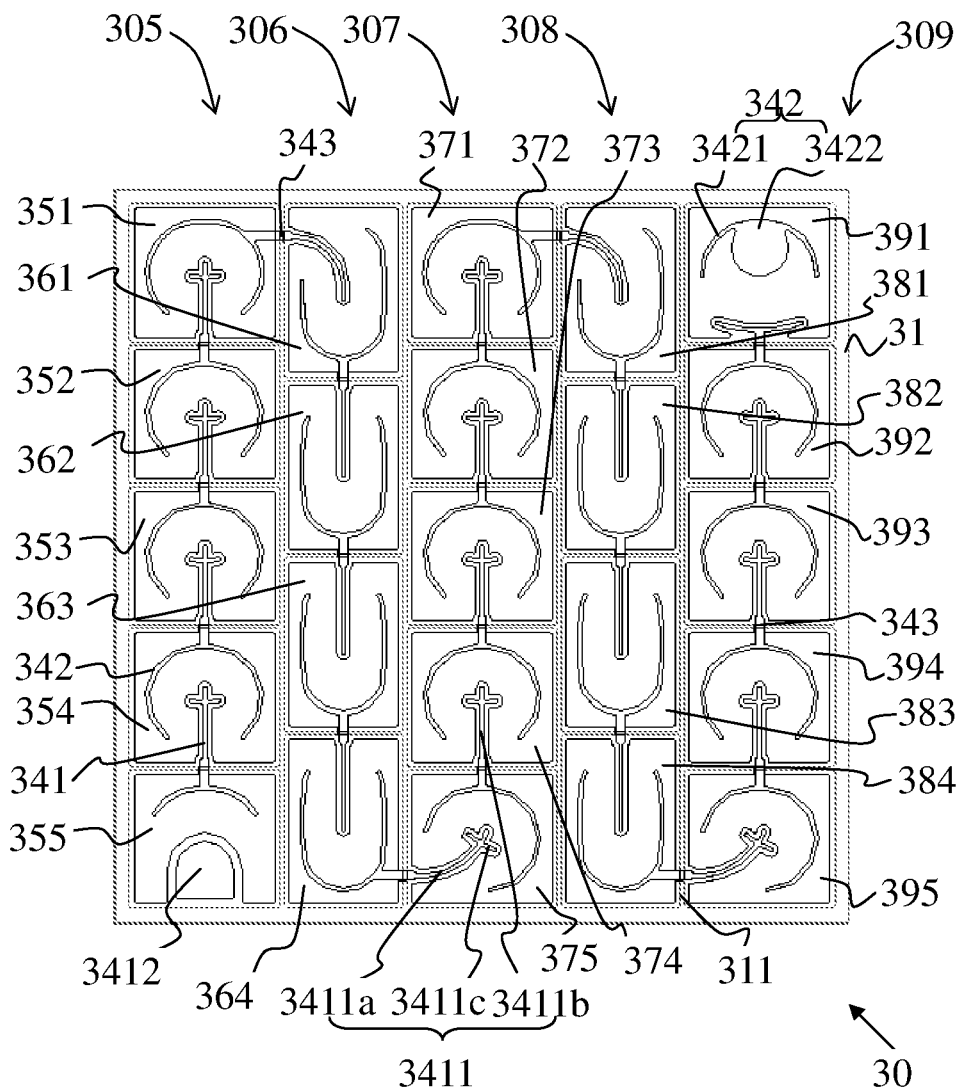
FIG. 8 illustrates a top view of the optoelectronic device in accordance with one embodiment of the present application.
Figure 9:
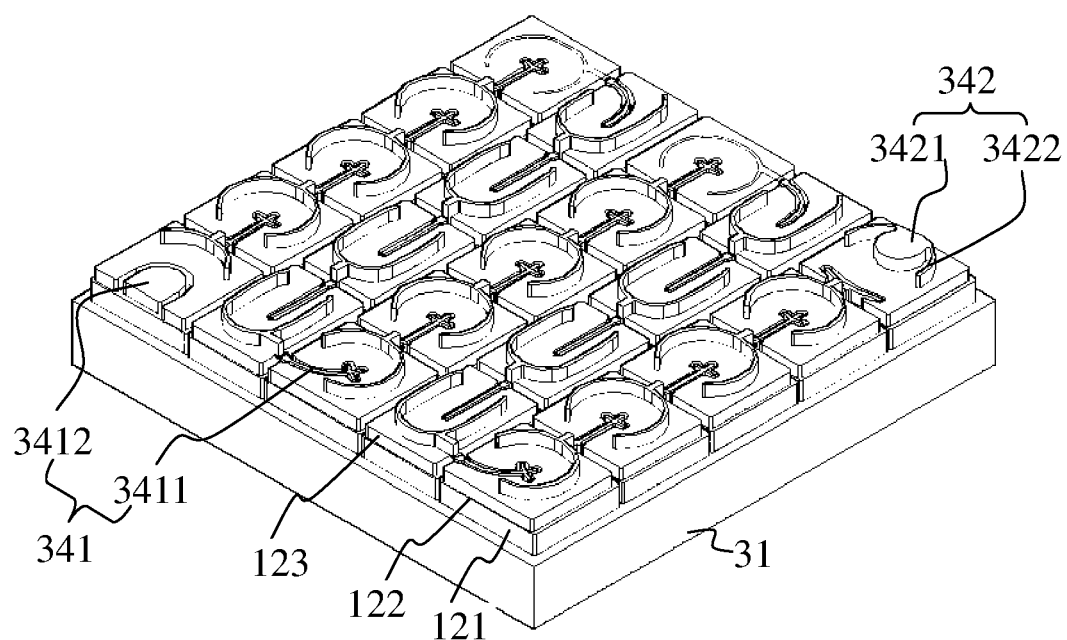
FIG. 9 illustrates a three-dimensional view of the optoelectronic device shown in FIG. 8.

FIG. 8 illustrates a top view of an optoelectronic device 30 in accordance with the third embodiment of the present application. Referring to FIGS. 8-9, the optoelectronic device 30 includes a plurality of semiconductor units formed on a substrate 31, first electrodes 341, second electrodes 342, and connecting parts 343 formed on the semiconductor units. The structure of the semiconductor units includes the first semiconductor layer 121, the second semiconductor layer 123, and the active region 122 interposed between thereof. A plurality of separation grooves 311 are formed between the semiconductor units. A plurality of first electrodes 341 and second electrodes 342 are formed on the optoelectronic device 30. The first electrodes 341 with a first extension 3411 are formed on the semiconductor units other than the semiconductor unit 355, and the second electrodes 342 formed on each semiconductor units include a second extension 3421. The first electrode 341 formed on one of the semiconductor units includes a first pad 3412, and the second electrode 342 formed on another one of the semiconductor units includes a second pad 3422.

In the embodiment, the size of the optoelectronic device 30 is 50×50 mil$^2$, and the driving voltage is 72 V. The driving voltage of each semiconductor unit is about 3 V. The area of each semiconductor unit is the same with each other. The optoelectronic device 30 includes twenty-three semiconductor units arranged in five columns 305, 306, 307, 308, and 309. The first column 305 includes five semiconductor units 351, 352, 353, 354, and 355 connected in series in a first orientation. The second column 306 includes four semiconductor 361, 362, 363, and 364 units connected in series in a second orientation. The third column 307 includes five semiconductor units 371, 372, 373, 374, and 375 connected in series in a first orientation. The fourth column 308 includes four semiconductor units 381, 382, 383, and 384 connected in series in a second orientation. The fifth column 309 includes five semiconductor units 391, 392, 393, 394, and 395 connected in series in a first orientation.

The shape of the semiconductor units in the second and fourth columns 306 and 308 is different from that of the semiconductor units in the other columns. Referring to FIG. 8 and FIG. 9, the layouts of the electrode on semiconductor units in first column 305, third column 307, and fifth column 309 are similar to each other except that of the electrode on the semiconductor units 351, 355, 371, 375, 391, and 395. The layouts of the electrode on the semiconductor units in second column 306 and fourth column 308 are the same except that of the electrode on the semiconductor units 361, 364, 381, and 384. The first extensions 3411 can be curve extensions 3411a disposed on the semiconductor units 361, 375, 381, 391, and 394 close to the edge of the substrate 31, or straight extensions 3411b disposed on the other semiconductor units. All of the second extensions 3421 are curve extensions.

The first extensions 3411 of the semiconductor units in first, third, and fifth columns 305, 307, 309 other than the semiconductor units 375 and 395 are extended from the first edge of the semiconductor units to the second edge; the second extensions 3421 are extended from the first edge to the second edge. The first extensions 3411 of the semiconductor units 375 and 395 are extended from a third edge of the semiconductor units 375 and 395 to the second edge. The first extensions 3411 of the semiconductor units in second and fourth columns 306, 308 other than the semiconductor units 361 and 381 are extended from the second edge to the first edge; the second extensions 3421 are extended from the first edge to the second edge. The first extensions 3411 of the semiconductor units 361 and 381 are extended from a third edge of the semiconductor units 361 and 381 to the first edge. The curve extensions of the first extensions 3411 and the second extension 3421 are not parallel to the edge of the semiconductor units. In this embodiment, the second extensions 3421 are disposed substantially around the edges of the semiconductor units and the first extensions are interposed between thereof. Secondary extensions 3411c extended from the curve extension 3411a and the straight extension 3411b can be optionally formed to increase the current spreading.

The first pad 3412 and the second pad 3422 are formed on the semiconductor units 355 and 391 respectively. The second pad 3422 is in contact with the second extension 3421 on the semiconductor units 391. The pads are formed for wire bonding or flip chip type bonding and arranged on the different semiconductor units on the corner regions of the substrate 31 respectively.

Figure 10:
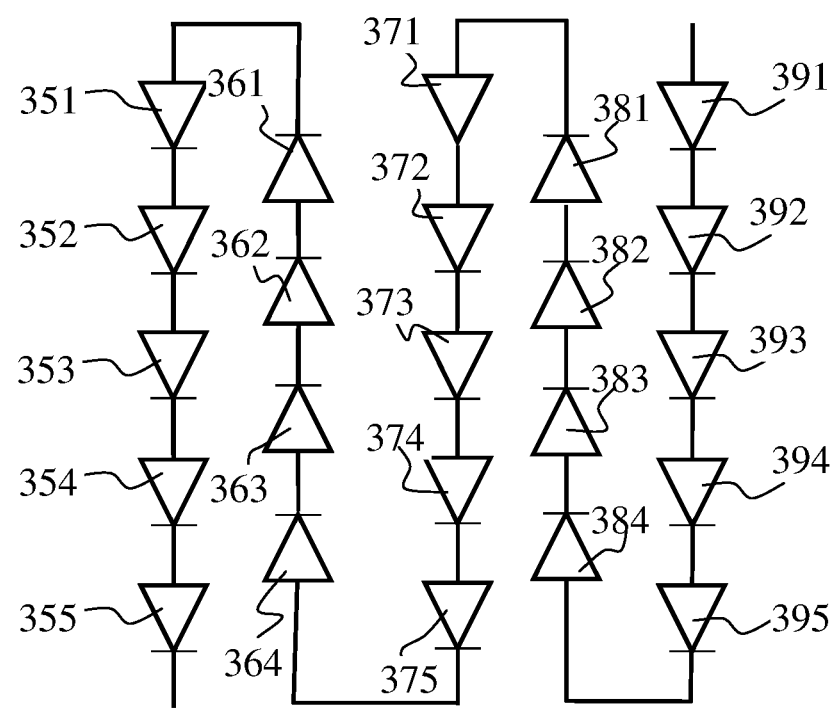
FIG. 10 illustrates an equivalent circuit diagram of the optoelectronic device shown in FIG. 8.

In the embodiment, connecting parts 343 form a serial connection between the semiconductor units in the first, third, and fifth columns 305, 307, 309 in the first orientation, and a reverse serial connection between the semiconductor units in the second, and fourth columns 306, 309 in the second orientation. The columns connect in series between the semiconductor units 351 and 361, 364 and 375, 371 and 381, and 384 and 395 by connecting parts 343. There is only one connecting part 343 between each two semiconductor units. FIG. 10 is an equivalent circuit diagram of the optoelectronic device 30 shown in FIG. 8.

Figure 11:
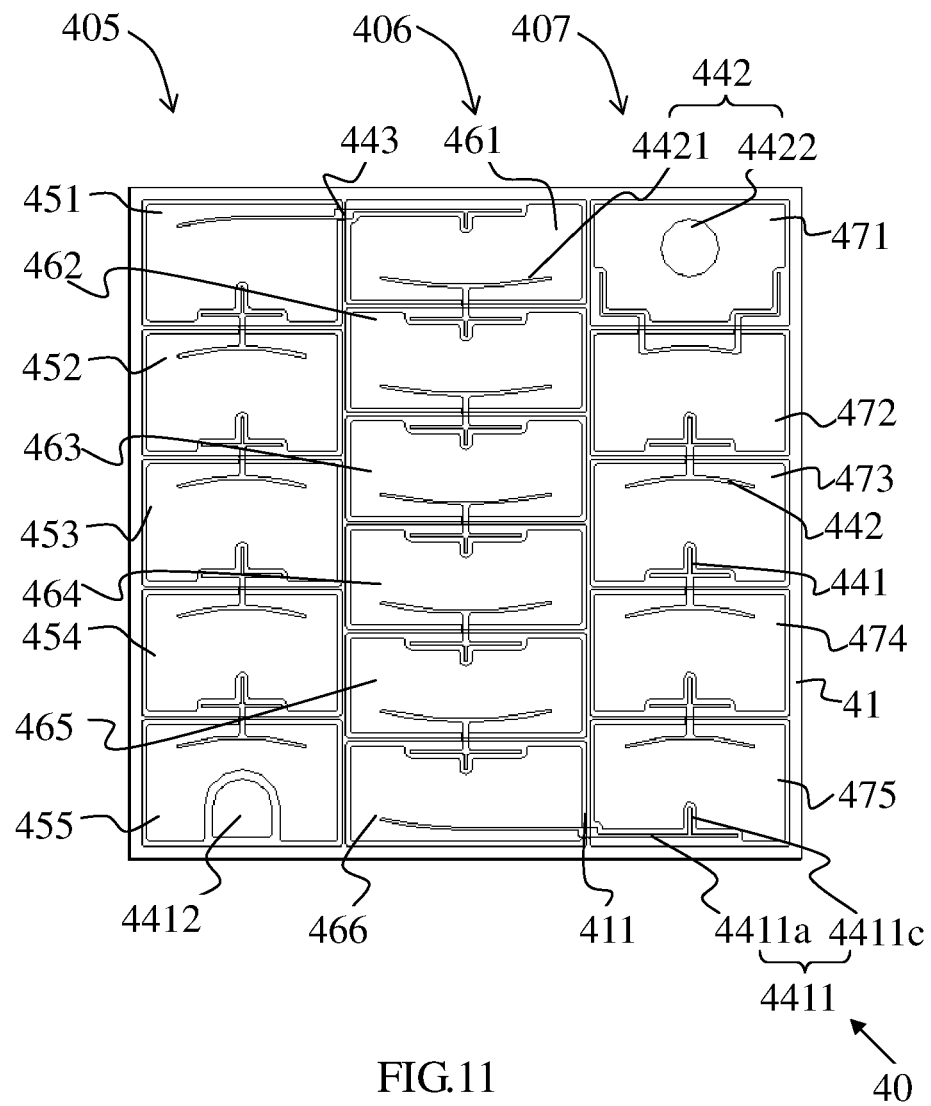
FIG. 11 illustrates a top view of the optoelectronic device in accordance with one embodiment of the present application.
Figure 12:
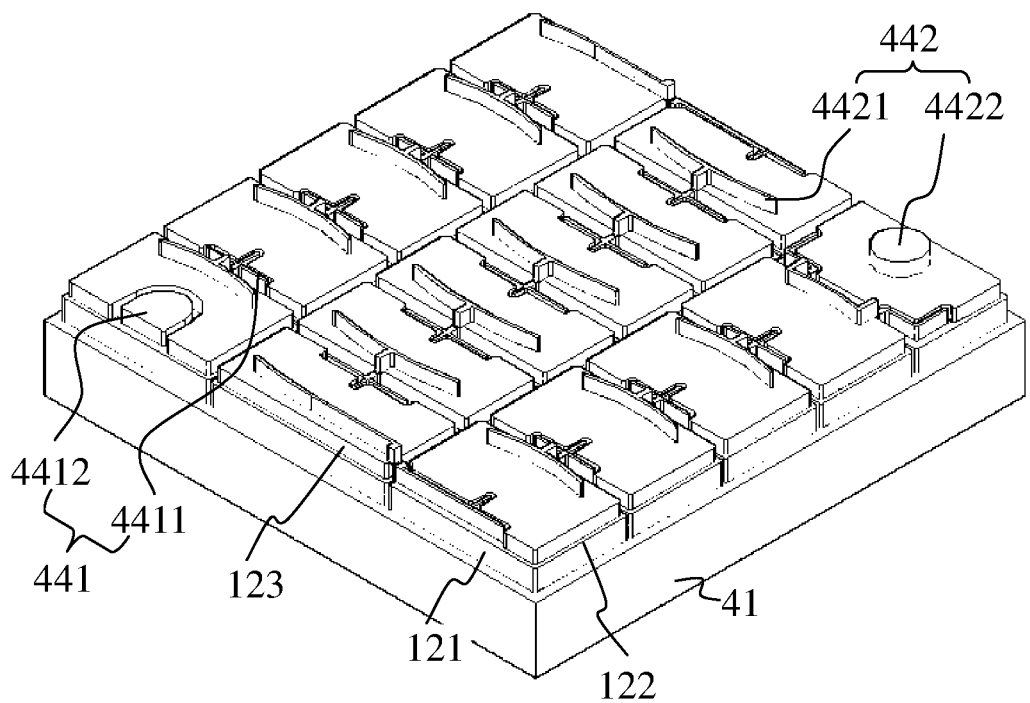
FIG. 12 illustrates a three-dimensional view of the optoelectronic device shown in FIG. 11.

FIG. 11 illustrates a top view of an optoelectronic device 40 in accordance with the fourth embodiment of the present application. Referring to FIGS. 11-12, the optoelectronic device 40 includes a plurality of semiconductor units formed on a substrate 41, first electrodes 441, second electrodes 442, and connecting parts 443 formed on the semiconductor units. The structure of the semiconductor units includes the first semiconductor layer 121, the second semiconductor layer 123, and the active region 122 interposed between thereof. A plurality of separation grooves 411 are formed between the semiconductor units. A plurality of first electrodes 441 and second electrodes 442 are formed on the optoelectronic device 40. The first electrodes 441 with a first extension 4411 are formed on the semiconductor units other than the semiconductor unit 455, and the second electrodes 442 with a second extension 4421 are formed on the semiconductor units other than the semiconductor unit 471. The first electrode 441 formed on one of the semiconductor units includes a first pad 4412, and the second electrode 442 formed on another one of the semiconductor units includes a second pad 4422.

In the embodiment, the size of the optoelectronic device 40 is 45×45 mil², and the driving voltage is 48 V. The driving voltage of each semiconductor unit is about 3 V. According to the equation of the number of semiconductor unit, the optoelectronic device 40 includes sixteen semiconductor units arranged in three columns 405, 406, and 407. The first column 405 includes five semiconductor units 451, 452, 453, 454, and 455 connected in series in a first orientation. The second column 406 includes six semiconductor units 461, 462, 463, 464, 465, and 466 connected in series in a second orientation. The third column 407 includes five semiconductor units 471, 472, 473, 474, and 475 connected in series in the first orientation.

The shape of the semiconductor units in the second column 402 is different from that of the semiconductor units in the other columns. Referring to FIG. 11 and FIG. 12, the layouts of the electrode on semiconductor units in first column 405, and third column 407 are similar to each other except that of the semiconductor units 451, 455, 471, and 475. The first extension 4411 includes a straight extension 4411a and a secondary extension 4411c. All of the second extensions 4421 are curve extensions. The first extensions 4411 of the semiconductor units in first and second columns 405, 407 are extended from the first edge of the semiconductor units to the third and fourth edges adjacent to the first edge; and the second curve extensions 4421 are extended from the second edge to the third and fourth edges. The first extensions 4411 of the semiconductor units in second column 406 is extended from the second edge to the third and fourth edges; and the second extensions 4421 are extended from the first edge to the third and fourth edges. The curve extensions 4411 and 4421 are not parallel to any edge of the semiconductor units.

Figure 13:
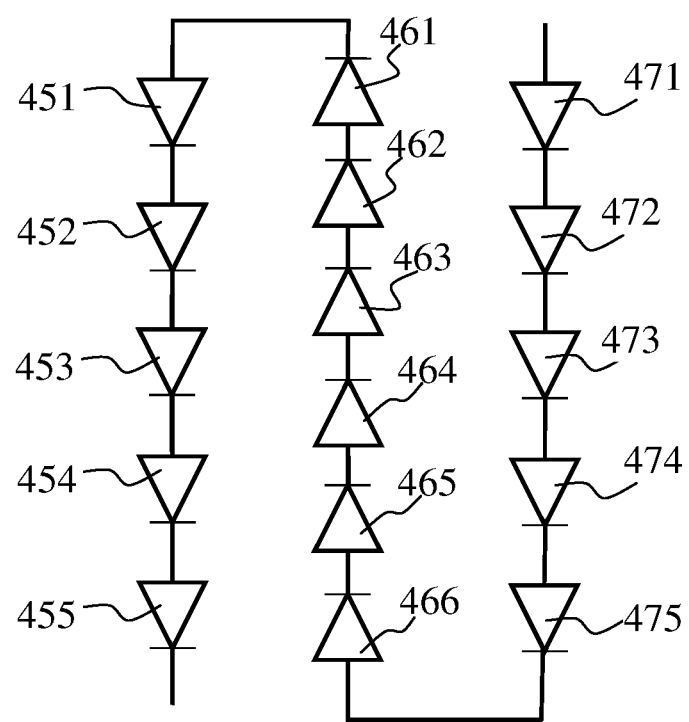
FIG. 13 illustrates an equivalent circuit diagram of the optoelectronic device shown in FIG. 11.

The first pad 4412 and the second pad 4422 are formed on the semiconductor units 455 and 471 respectively. Connecting parts 443 form a serial connection between the semiconductor units. FIG. 13 is an equivalent circuit diagram of the optoelectronic device 40 shown in FIG. 11.

Figure 14:
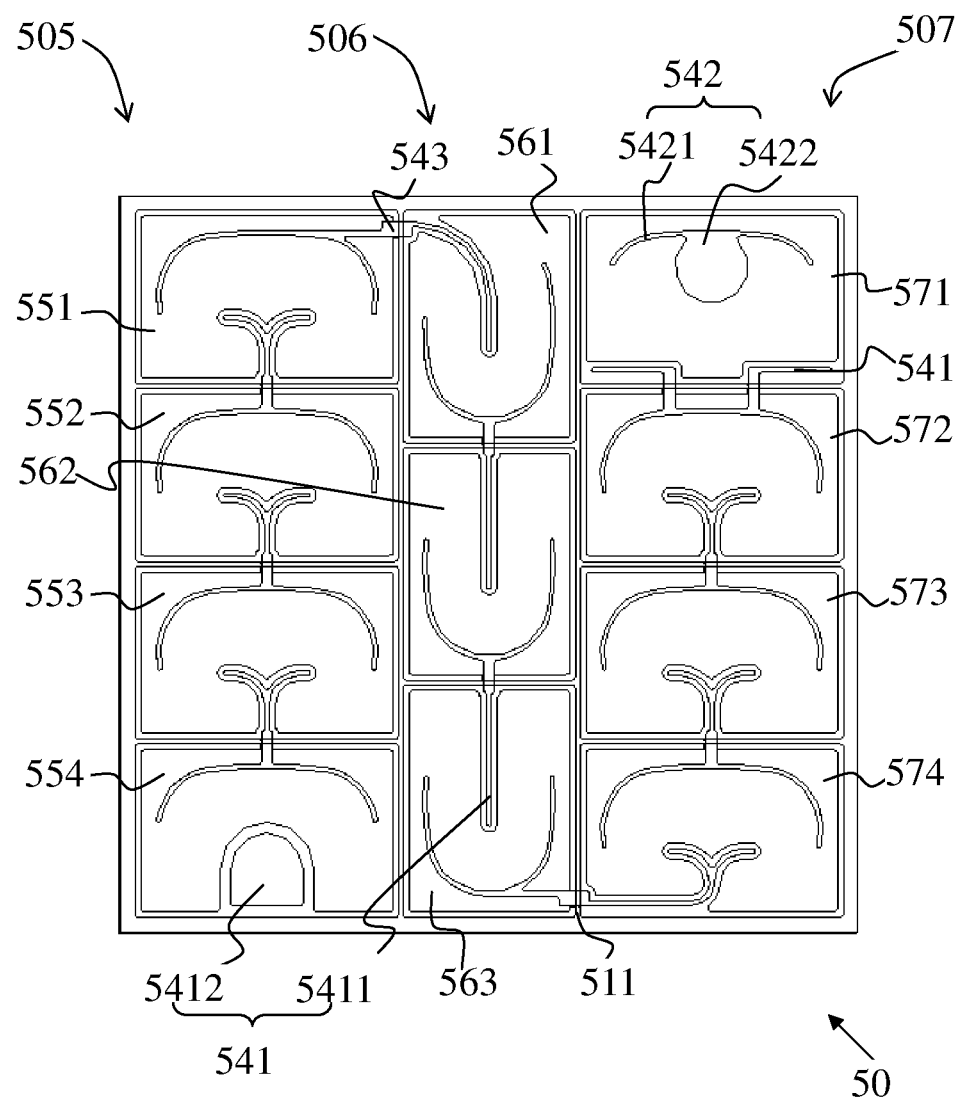
FIG. 14 illustrates a top view of the optoelectronic device in accordance with one embodiment of the present application.
Figure 15:
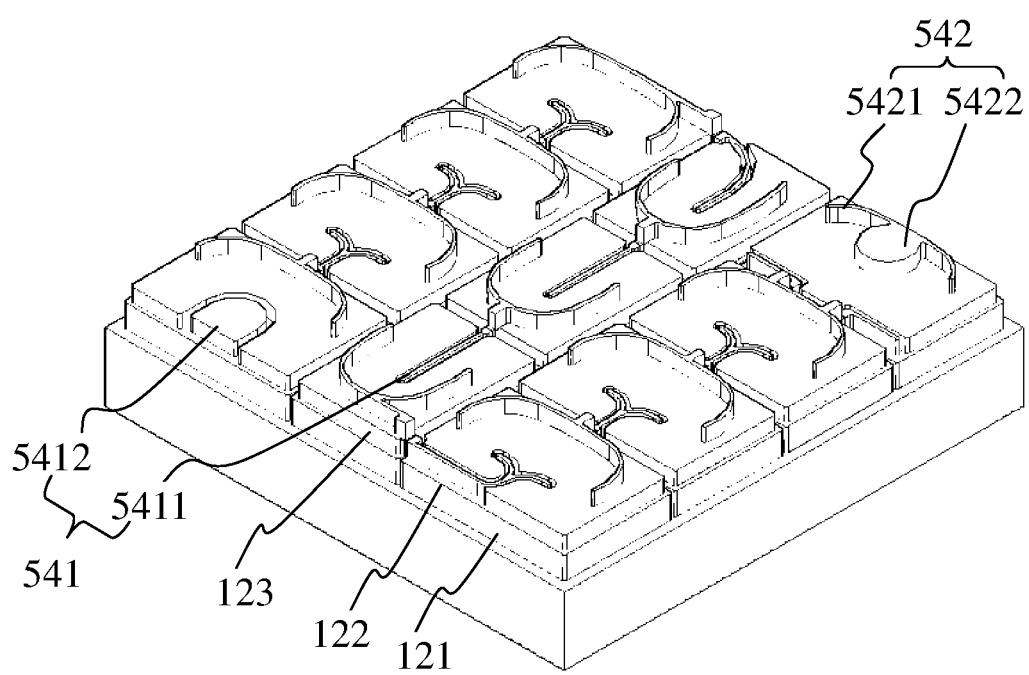
FIG. 15 illustrates a three-dimensional view of the optoelectronic device shown in FIG. 14.
Figure 16:
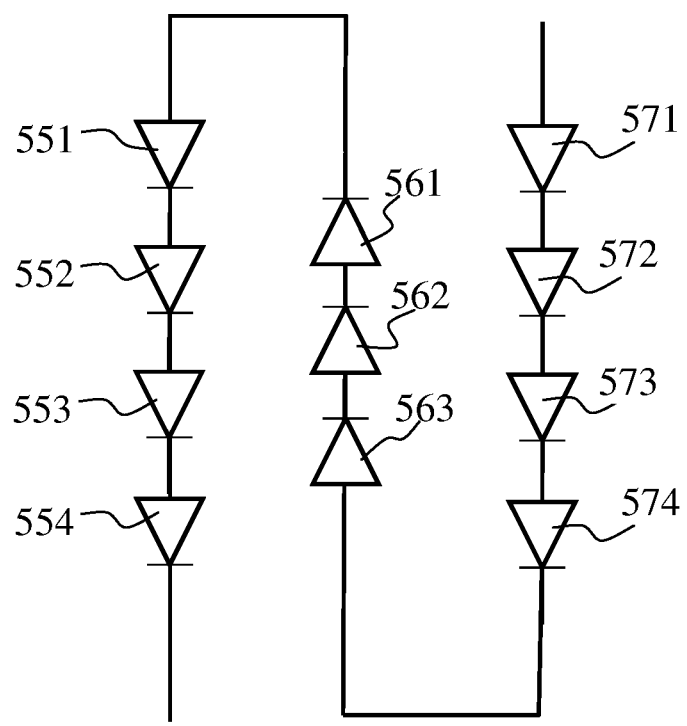
FIG. 16 illustrates an equivalent circuit diagram of the optoelectronic device shown in FIG. 14.

FIG. 14 illustrates a top view of an optoelectronic device 50 in accordance with the fifth embodiment of the present application. FIG. 15 illustrates a three-dimensional view of the optoelectronic device 50. The size of the optoelectronic device 50 is 40×40 mil², and the driving voltage is 36 V. The driving voltage of each semiconductor unit is about 3 V. According to the equation $$\left(\frac{V}{V_f} - 1\right),$$

in this embodiment, the optoelectronic device 50 includes eleven semiconductor units arranged in three columns 505, 506, and 507. The first column 505 includes four semiconductor units 551, 552, 553, and 554 connected in series in a first orientation. The second column 506 includes three semiconductor units 561, 562, and 563 connected in series in a second orientation. The third column 507 includes four semiconductor units 571, 572, 573, and 574 connected in series in the first orientation. The first electrodes 541 with a first extension 5411 are formed on the semiconductor units other than the semiconductor unit 554, and the second electrodes 542 include a second extension 5421 are formed on all of the semiconductor units. The first electrode 541 formed on the semiconductor unit 554 includes a first pad 5412, and the second electrode 542 formed on the semiconductor unit 571 includes a second pad 5422. Connecting parts 543 form a serial connection between the semiconductor units. FIG. 16 is an equivalent circuit diagram of the optoelectronic device 50 shown in FIG. 14.

Figure 17:
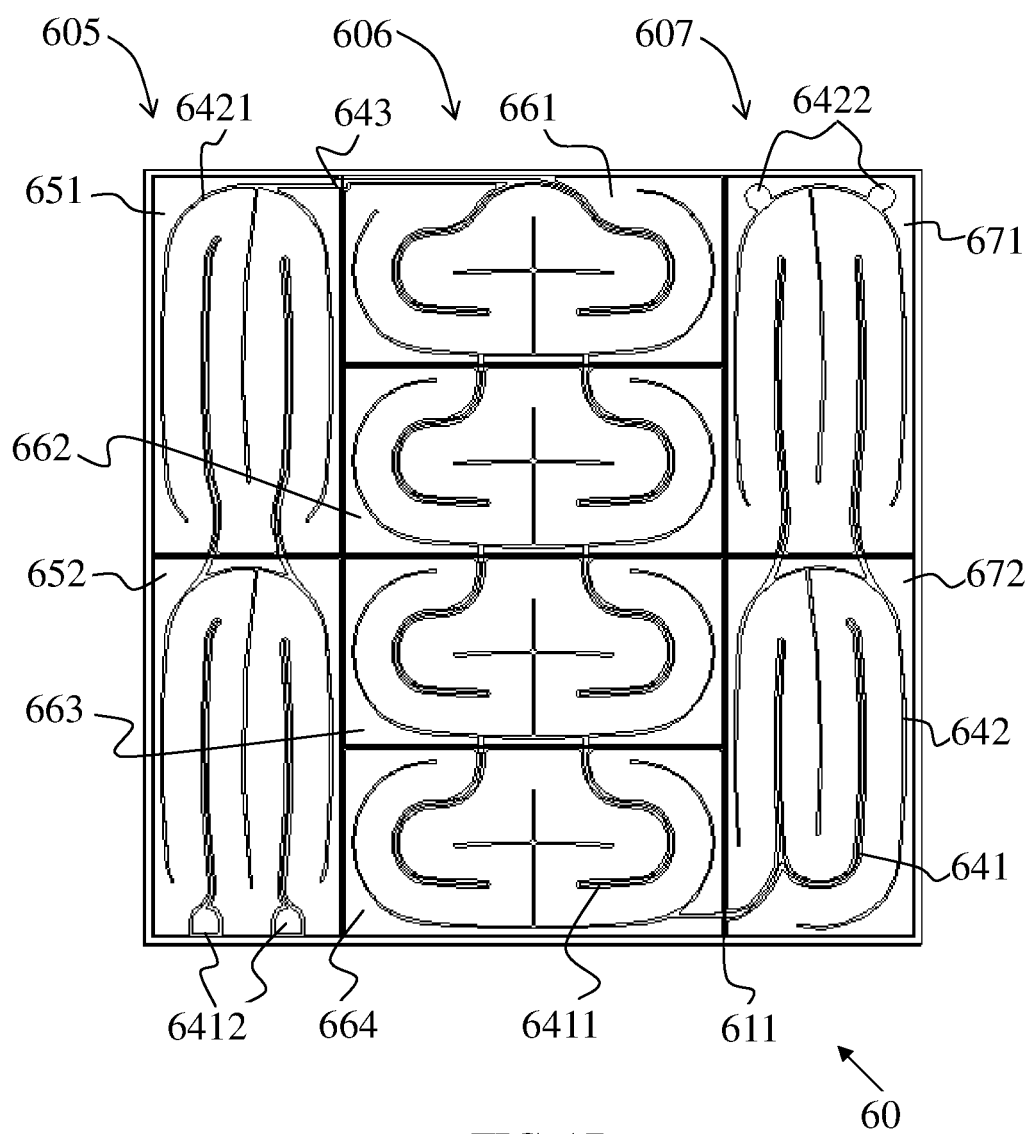
FIG. 17 illustrates a top view of the optoelectronic device in accordance with one embodiment of the present application.
Figure 18:
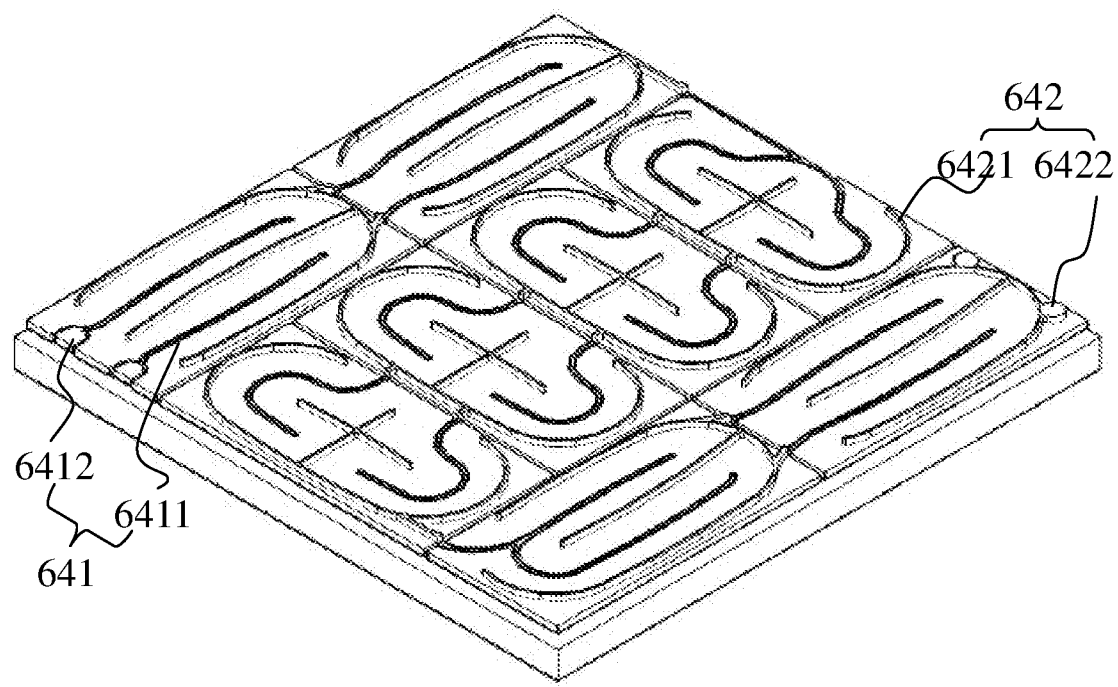
FIG. 18 illustrates a three-dimensional view of the optoelectronic device shown in FIG. 17.
Figure 19:
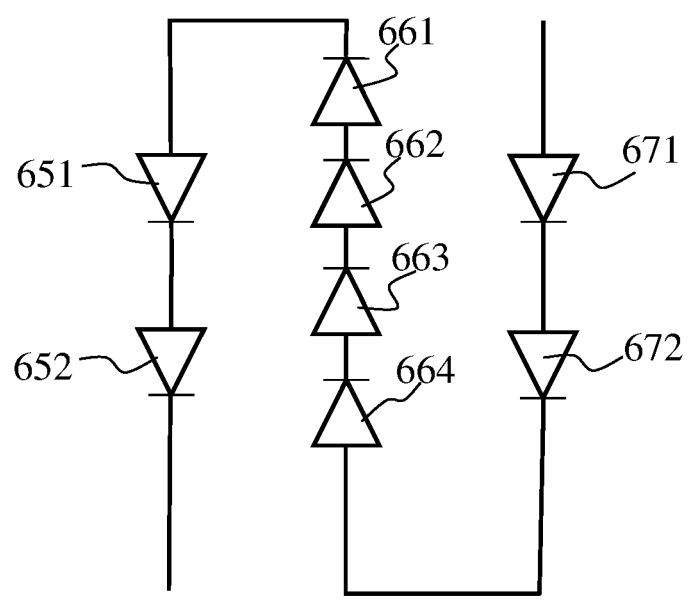
FIG. 19 illustrates an equivalent circuit diagram of the optoelectronic device shown in FIG. 17.

FIG. 17 illustrates a top view of an optoelectronic device 60 in accordance with the sixth embodiment of the present application. FIG. 18 illustrates a three-dimensional view of the optoelectronic device 60. The size of the optoelectronic device 60 is 120×120 mil², and the driving voltage is 24 V. The driving voltage of each semiconductor unit is about 3 V. According to the equation $$\left(\frac{V}{V_f}\right),$$

in this embodiment, the optoelectronic device 60 includes eight semiconductor units arranged in three columns 605, 606, and 607. The first column 605 includes two semiconductor units 651, and 652 connected in series in a first orientation. The second column 606 includes four semiconductor units 661, 662, 653, and 664 connected in series in a second orientation. The third column 607 includes two semiconductor units 671, and 672 connected in series in the first orientation. The first electrodes 641 include a first extension 6411, and the second electrodes 642 include a second extension 6421. The first electrode 641 formed on one of the semiconductor units includes two first pads 6412, and the second electrode 642 formed on another one of the semiconductor units includes two second pads 6422. Connecting parts 643 form a serial connection between the semiconductor units. FIG. 19 is an equivalent circuit diagram of the optoelectronic device 60 shown in FIG. 17.

Figure 20:
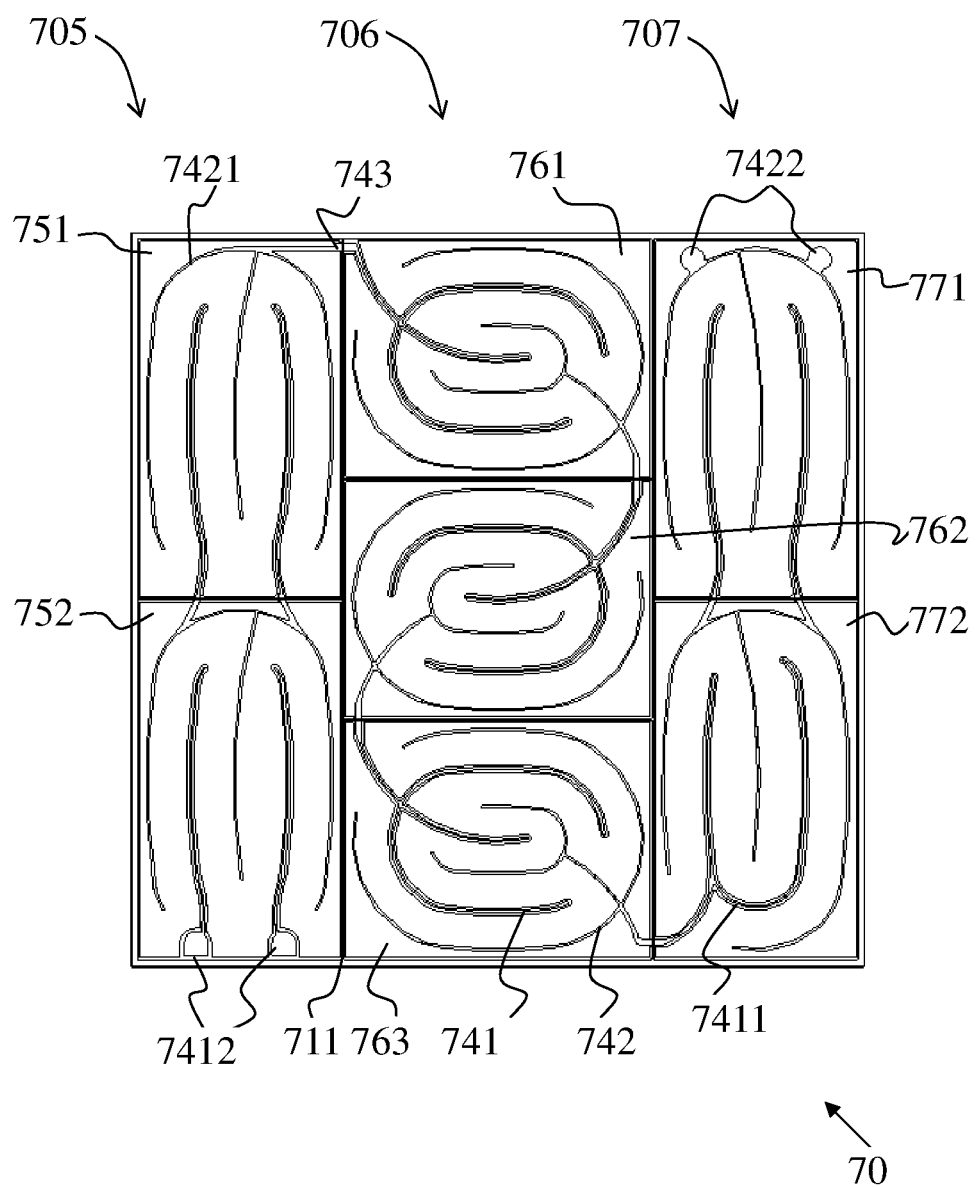
FIG. 20 illustrates a top view of the optoelectronic device in accordance with one embodiment of the present application.
Figure 21:
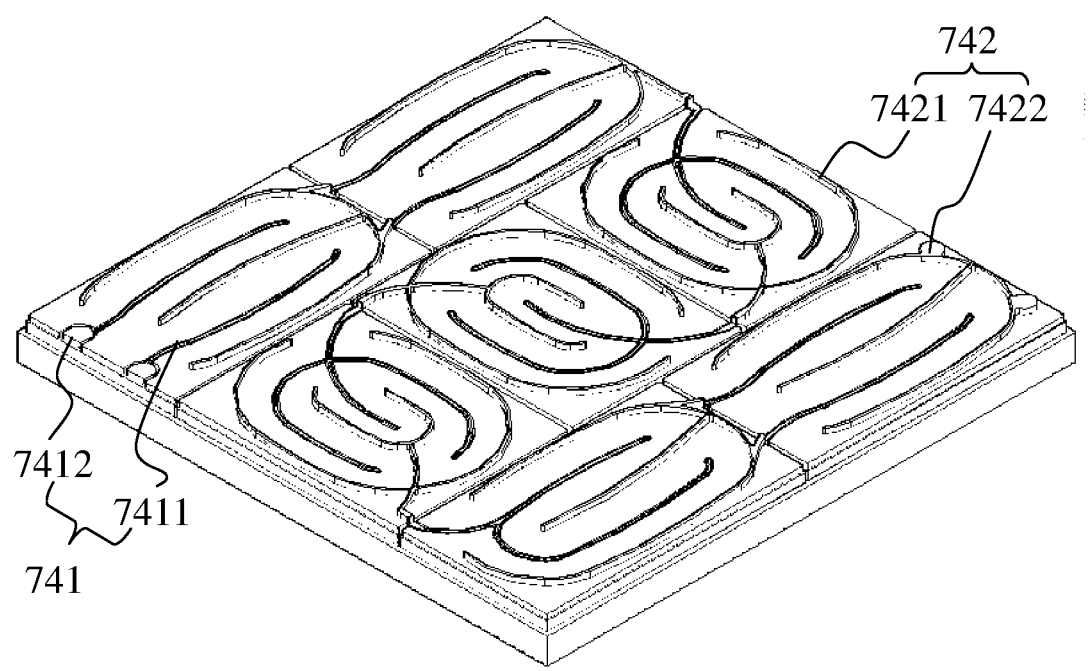
FIG. 21 illustrates a three-dimensional view of the optoelectronic device shown in FIG. 20.
Figure 22:
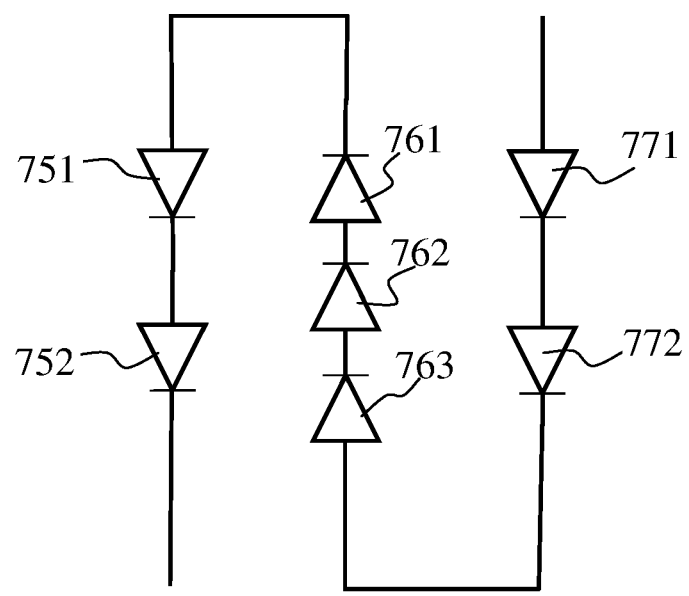
FIG. 22 illustrates an equivalent circuit diagram of the optoelectronic device shown in FIG. 20.

FIG. 20 illustrates a top view of an optoelectronic device 70 in accordance with the sixth embodiment of the present application. FIG. 21 illustrates a three-dimensional view of the optoelectronic device 70. The size of the optoelectronic device 70 is 120×120 mil², and the driving voltage is 24 V. The driving voltage of each semiconductor unit is about 3 V. According to the equation $$\left(\frac{V}{V_f} - 1\right),$$

in this embodiment, the optoelectronic device 70 includes seven semiconductor units arranged in three columns 705, 706, and 707. The first column 705 includes two semiconductor units 751, and 752 connected in series in a first orientation. The second column 706 includes three semiconductor units 761, 762, and 753 connected in series in a second orientation. The third column 707 includes two semiconductor units 771, and 772 connected in series in the first orientation. The first electrodes 741 include a first extension 7411, and the second electrodes 742 include a second extension 7421. The first electrode 741 formed on one of the semiconductor units includes two first pads 7412, and the second electrode 742 formed on another one of the semiconductor units includes two second pads 7422. Connecting parts 743 form a serial connection between the semiconductor units. FIG. 22 is an equivalent circuit diagram of the optoelectronic device 70 shown in FIG. 20.

Figure 23:
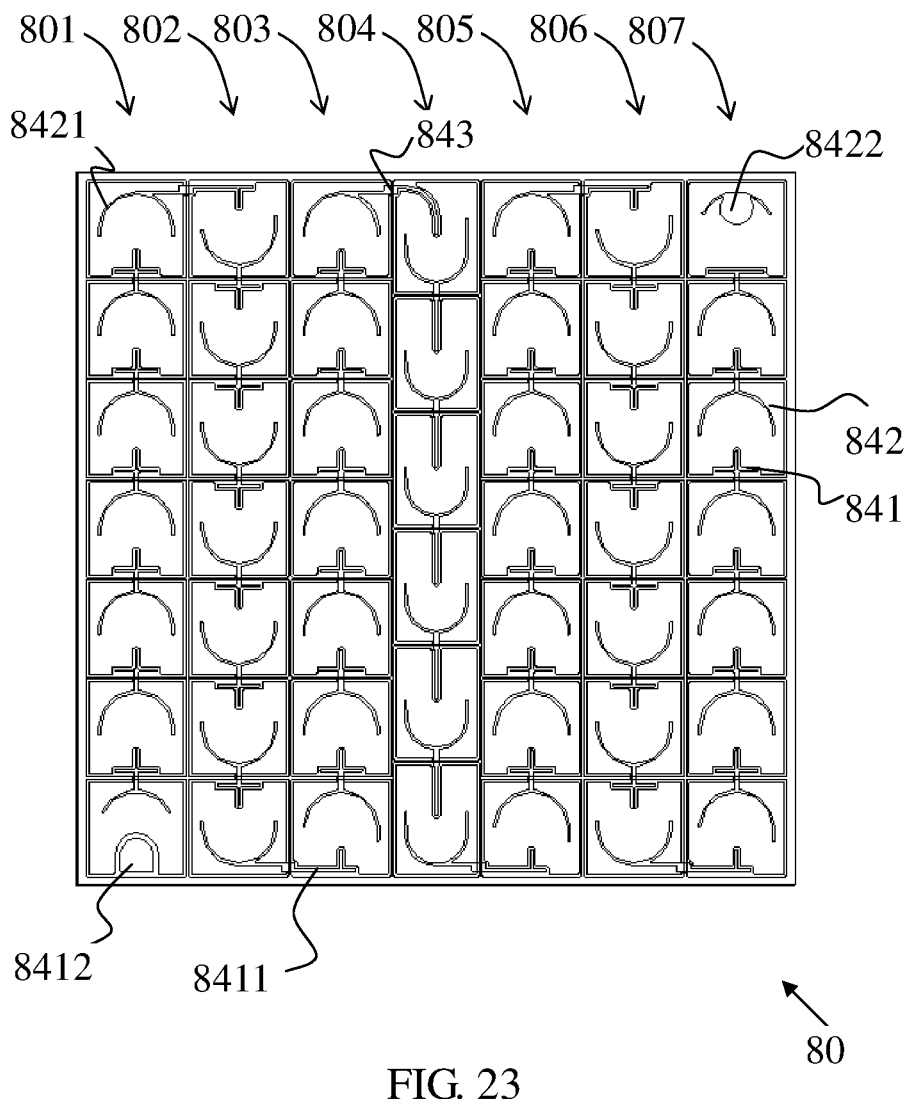
FIG. 23 illustrates a top view of the optoelectronic device in accordance with one embodiment of the present application.
Figure 24:
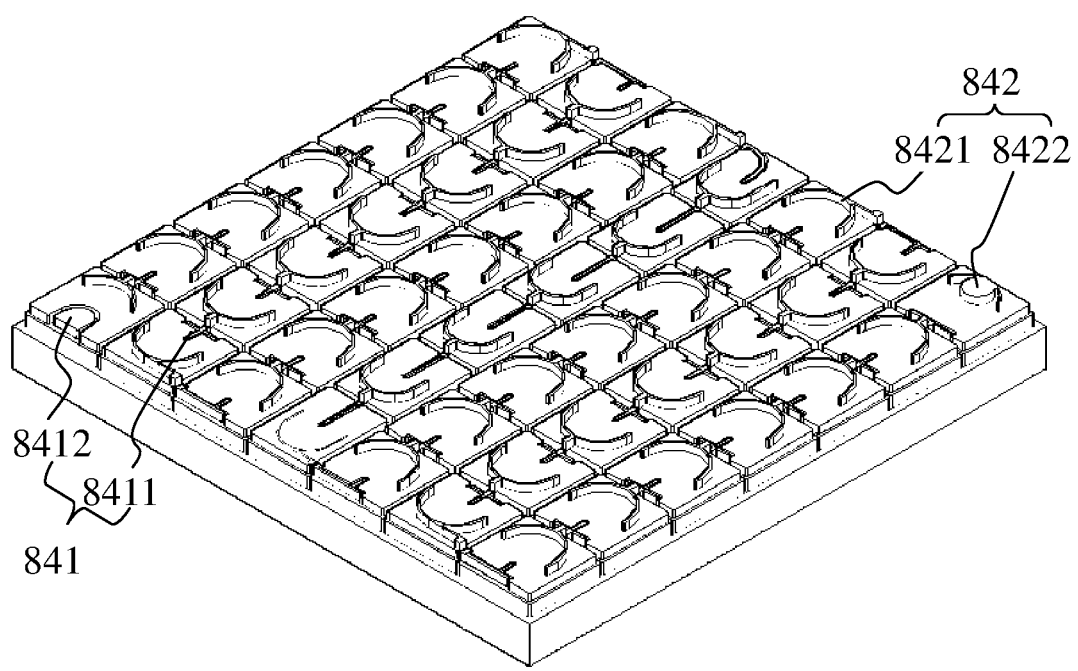
FIG. 24 illustrates a three-dimensional view of the optoelectronic device shown in FIG. 23.

FIG. 23 illustrates a top view of an optoelectronic device 80 in accordance with the seventh embodiment of the present application. FIG. 24 illustrates a three-dimensional view of the optoelectronic device 80. The size of the optoelectronic device 80 is 85×85 mil², and the driving voltage is 144 V. The driving voltage of each semiconductor unit is about 3 V. According to the equation $$\left(\frac{V}{V_f}\right),$$

in this embodiment, the optoelectronic device 80 includes forty-eight semiconductor units arranged in seven columns 801, 802, 803, 804, 805, 806, and 807. Each of the columns 801, 803, 805, and 807 includes seven semiconductor units connected in series in a first orientation. Each of the columns 802 and 806 includes seven semiconductor units connected in series in a second orientation. The fourth column 804 includes six semiconductor units connected in series in the first orientation. The first electrode 841 with a first extension 8411 are formed on the semiconductor units other than the semiconductor unit where a first pad 8412 is formed on, and the second electrode 842 includes a second extension 8421 are formed on all of the semiconductor units. The second electrode 842 formed on one of the semiconductor units includes a second pad 8422. Connecting parts 843 form a serial connection between the semiconductor units.

The material of the first semiconductor layer, the active region and the second semiconductor layer contains one or more elements selected from the group consisting of Ga, Al, In, As, P, N and Si, such as GaN, AlGaN, InGaN, AlGaInN, GaP, GaAs, GaAsP, GaNAs, or Si. The material of the substrate includes sapphire, GaAs, GaP, SiC, ZnO, GaN, AlN, Cu or Si.

Those having ordinary skill in the art will readily observe that numerous modifications and alterations of the device and method may be made while retaining the teachings of the invention. Accordingly, the above disclosure should be construed as limited only by the metes and bounds of the appended claims.

What is claimed is:
1. An optoelectronic device comprising:
a substrate;
a plurality of grooves on the substrate;
a plurality of semiconductor units on the substrate and separated from each other by the plurality of grooves, each of the plurality of semiconductor units comprising a first semiconductor layer, a second semiconductor layer, and an active region interposed between the first semiconductor layer and the second semiconductor layer;
wherein the plurality of semiconductor units comprises a first plurality of semiconductor units arranged in a first column and a second plurality of semiconductor units arranged in a second column, an amount of the first plurality of semiconductor units is an even number; and an amount of the second plurality of semiconductor units is an odd number; and
wherein the first plurality of semiconductor units comprising a first semiconductor unit comprising a first edge having a first length extending along a first direction, the second plurality of semiconductor units comprises a second semiconductor unit comprising a second edge having a second length extending along the first direction, and the first length is longer than the second length;
a connecting part connecting the first semiconductor unit and the second semiconductor unit;
a first electrode formed on the first semiconductor layer of each of the plurality of semiconductor units; and
a second electrode formed on the second semiconductor layer of each of the plurality of semiconductor units, wherein the first electrode on each one of the plurality of semiconductor units does not both connect to the second electrode on a first other one of the plurality of semiconductor units and the second electrode on a second other one of the plurality of semiconductor units.

2. The optoelectronic device according to claim 1, wherein the plurality of grooves comprises a first groove between adjacent two of the first plurality of semiconductor units, a second groove between adjacent two of the second plurality of semiconductor units, and a third groove between the first plurality of semiconductor units and the second plurality of semiconductor units.

3. The optoelectronic device according to claim 2, wherein the first groove is connected to a first position of the third groove, the second groove is connected to a second position of the third groove, and the first position is different from the second position.

4. The optoelectronic device according to claim 1, wherein a first electrode layout of the first electrode and the second electrode on one of the first plurality of semiconductor units is different from a second electrode layout of the first electrode and the second electrode on one of the second plurality of semiconductor units.

5. The optoelectronic device according to claim 1, wherein the plurality of semiconductor units are arranged to form a rectangular shape.

6. The optoelectronic device according to claim 5, wherein the first plurality of semiconductor units arranged in the first column are arranged to form a first rectangular shape, and the second plurality of semiconductor units arranged in the second column are arranged to form a second rectangular shape.

7. The optoelectronic device according to claim 6, wherein areas of the plurality of semiconductor units are substantially the same to each other.

8. The optoelectronic device according to claim 6, wherein an area size of the first rectangular shape is different from that of the second rectangular shape.

9. The optoelectronic device according to claim 6, wherein each of the first plurality of semiconductor units comprises same area size and shape to each other, each of the second plurality of semiconductor units comprises same area size and shape to each other, and a ratio of length and width of the shape of one of the first plurality of semiconductor units is different from that of one of the second plurality of semiconductor units.

10. The optoelectronic device according to claim 1, wherein one of the first plurality of semiconductor units comprises a first electrode layout of the first electrode and the second electrode different from that of others of the first plurality of semiconductor units, or one of the second plurality of semiconductor units comprises a second electrode layout of the first electrode and the second electrode different from that of others of the second plurality of semiconductor units.

11. An optoelectronic device comprising:
a substrate;

a plurality of grooves on the substrate;
a plurality of semiconductor units on the substrate and separated from each other by the plurality of grooves, each of the plurality of semiconductor units comprising a first semiconductor layer, a second semiconductor layer, and an active region interposed between the first semiconductor layer and the second semiconductor layer;
wherein the plurality of semiconductor units comprises a first plurality of semiconductor units arranged in a first column and a second plurality of semiconductor units arranged in a second column, an amount of the first plurality of semiconductor units is an odd number; and an amount of the second plurality of semiconductor units is an even number; and
wherein the first plurality of semiconductor units comprises a first semiconductor unit comprising a first edge having a first length extending along a first direction, the second plurality of semiconductor units comprises a second semiconductor unit comprising a second edge having a second length extending along the first direction, and the first length is longer than the second length;
a connecting part connecting the first semiconductor unit and the second semiconductor unit;
a first electrode formed on the first semiconductor layer of each of the plurality of semiconductor units; and
a second electrode formed on the second semiconductor layer of each of the plurality of semiconductor units, wherein the first electrode on each one of the plurality of semiconductor units does not both connect to the second electrode on a first other one of the plurality of semiconductor units and the second electrode on a second other one of the plurality of semiconductor units.

12. The optoelectronic device according to claim 11, wherein the plurality of grooves comprises a first groove between adjacent two of the first plurality of semiconductor units, a second groove between adjacent two of the second plurality of semiconductor units, and a third groove between the first plurality of semiconductor units and the second plurality of semiconductor units.

13. The optoelectronic device according to claim 12, wherein the first groove is connected to a first position of the third groove, the second groove is connected to a second position of the third groove, and the first position is different from the second position.

14. The optoelectronic device according to claim 11, wherein an electrode layout of the first electrode and the second electrode on one of the first plurality of semiconductor units is different from an electrode layout of the first electrode and the second electrode on one of the second plurality of semiconductor units.

15. The optoelectronic device according to claim 11, wherein the plurality of semiconductor units are arranged to form a rectangular shape.

16. The optoelectronic device according to claim 15, wherein the first plurality of semiconductor units arranged in the first column are arranged to form a first rectangular shape, and the second plurality of semiconductor units arranged in the second column are arranged to form a second rectangular shape.

17. The optoelectronic device according to claim 16, wherein areas of the plurality of semiconductor units are substantially the same to each other.

18. The optoelectronic device according to claim 16, wherein an area size of the first rectangular shape is different from that of the second rectangular shape.

19. The optoelectronic device according to claim 16, wherein each of the first plurality of semiconductor units comprises same area size and shape to each other, each of the second plurality of semiconductor units comprises same area size and shape to each other, and a ratio of length and width of the shape of one of the first plurality of semiconductor units is different from that of one of the second plurality of semiconductor units.

20. The optoelectronic device according to claim 11, wherein one of the first plurality of semiconductor units comprises a first electrode layout of the first electrode and the second electrode different from that of others of the first plurality of semiconductor units, or one of the second plurality of semiconductor units comprises a second electrode layout of the first electrode and the second electrode different from that of others of the second plurality of semiconductor units.

* * * * *